United States Patent [19]

Nagai et al.

[11] Patent Number: 5,041,893
[45] Date of Patent: Aug. 20, 1991

[54] SEMICONDUCTOR INTEGRATED CIRCUIT INCLUDING AN INTRINSIC MOS TRANSISTOR FOR GENERATING A REFERENCE VOLTAGE

[75] Inventors: Takeshi Nagai, Tokyo; Syuso Fujii, Kanagawa, both of Japan

[73] Assignee: Kanushiki Kaisha Toshiba, Kawasaki, Japan

[21] Appl. No.: 560,721

[22] Filed: Jul. 31, 1990

[30] Foreign Application Priority Data

Aug. 23, 1989 [JP] Japan .................. 1-214855

[51] Int. Cl.$^5$ .................. H01L 27/02; H01L 29/12; H03K 3/353; H03K 5/153
[52] U.S. Cl. .................. 357/41; 357/23.12; 357/58; 357/51; 357/91; 307/231; 307/304; 307/363
[58] Field of Search .................. 357/41, 23.1, 23.12, 357/51, 58, 42, 91; 307/303, 304, 231, 354, 362, 363

*Primary Examiner*—Mark Prenty
*Attorney, Agent, or Firm*—Oblon, Spivak, McClelland, Maier & Neustadt

[57] ABSTRACT

A semiconductor integrated cirucit for generating a reference voltage, including a semiconductor substrate, a first voltage terminal connected to a first voltage source, a resistor connected to the first voltage terminal, a second voltage terminal connected to a second voltage source, an intrinsic MOS and having a source, a drian, a gate and a channel having no ion-implantation for threshold control, a first wiring connected to the resistor and the source, a second wiring connected to the second voltage terminal and the drain, a third wiring connected to the drain and the gate, and an output terminal connected to the first wiring for connecting the resistor to the source. In addition, in one embodiment, there is further provided a power source voltage generating circuit formed in the semiconductor substrate, wherein a reference voltage input terminal of the semiconductor integrated circuit for generating the reference voltage is connected to the reference voltage output terminal, and a predetermined operation is performed in accordance with the potential of the reference voltage input terminal.

17 Claims, 5 Drawing Sheets

SEMICONDUCTOR INTEGRATED CIRCUIT INCLUDING AN INTRINSIC MOS TRANSISTOR FOR GENERATING A REFERENCE VOLTAGE

BACKGROUND OF THE INVENTION

1. Field of the Invention

The present invention relates to a semiconductor integrated circuit including a MOS transistor for generating a reference voltage.

2. Description of Background

Figure 1:
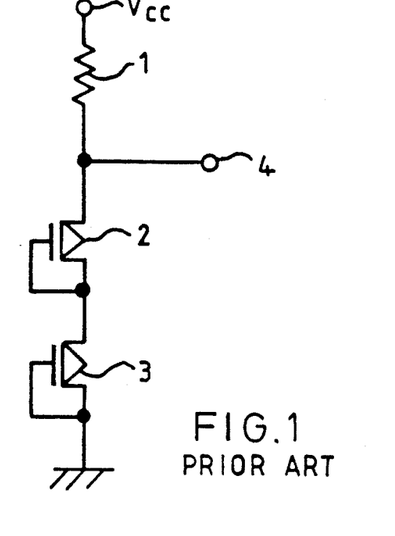
FIG. 1 is a circuit diagram showing a conventional reference voltage generating circuit.

FIG. 1 shows a conventional semiconductor integrated circuit for generating a reference voltage. This circuit includes a resistor 1 connected at one end to a power source Vcc, a first MOS transistor 2 formed with channel ion-implantation and serving as a first diode having an anode connected to the other end of the resistor 1, and a second MOS transistor 3 formed with channel ion-implantation and serving as a second diode 3 having an anode connected to the cathode of the first MOS transistor 2 and a cathode connected to a power source at ground potential. The node between the resistor 1 and the first MOS transistor 2 is connected to an output terminal 4.

In this semiconductor integrated circuit, the sum of a forward voltage drop VF of the first MOS transistor 2 and a forward voltage drop VF' of the second MOS transistor is outputted from the output terminal 4. Thus, this circuit has been conventionally used when it is desired that a voltage greater than the forward voltage drop of one diode be outputted from the output terminal 4. Namely, a plurality of diodes are connected in series, as shown in FIG. 1, and the sum of the forward voltage drops of the diodes is outputted from the output terminal 4.

In this semiconductor integrated circuit, however, the voltage at the output terminal 4 varies easily, depending on the operating temperature. Further, the characteristics of this type of semiconductor integrated circuits vary depending upon manufacturing conditions, and it is difficult to attain the desired output voltage with high precision. Very small variations in the manufacturing conditions lead to non-uniformity in the forward voltage drop of the manufactured products, and the forward voltage drop of the diode varies considerably as a function of the operating temperature. Furthermore, since a number of such diodes are employed in order to produce an output voltage greater than the forward voltage drop of one diode, variations in characteristics of manufactured semiconductor integrated circuits increase, and the output voltage of the circuits vary accordingly.

SUMMARY OF THE INVENTION

Accordingly, a first object of the present invention is to provide a new and improved reference voltage generating circuit for generating a desired output voltage with high precision, which is less affected by variations in manufacturing conditions or operating temperature.

A second object of this invention is to provide a power source voltage generating circuit which is operated stably by the precise output voltage generated by the reference voltage generating circuit.

According to a first feature of the present invention, there is provided a semiconductor integrated circuit for generating a reference voltage including a semiconductor substrate; a first voltage terminal connected to a first voltage source; a load element formed in the semiconductor substrate and having two ends, one of which is connected to the first voltage terminal; a second voltage terminal connected to a second voltage source; an intrinsic MOS transistor formed in the semiconductor substrate and having a source, a drain, a gate and a channel having no ion-implantation for threshold control; means for connecting the other end of the load element to the source; means for connecting the second voltage terminal to the drain; means for connecting the drain to the gate; and an output terminal connected to the means for connecting the other end of the load element to the source.

In addition, according to the present invention, there is provided a power source voltage generating circuit formed in the semiconductor substrate wherein an output terminal of the semiconductor circuit for generating the reference voltage is connected to a reference voltage input terminal of the power source voltage generating circuit, and a predetermined operation is performed in accordance with the potential of the reference voltage input terminal.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 2:
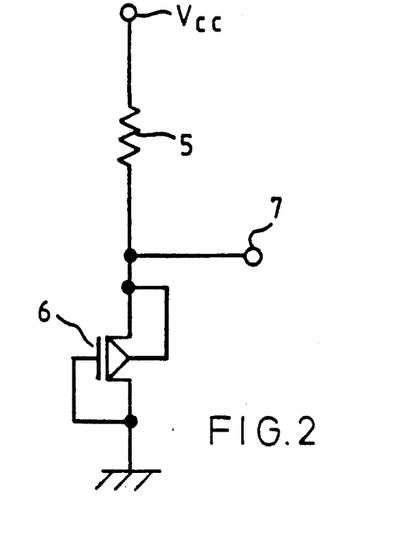
FIG. 2 is a circuit diagram showing a reference voltage generating circuit according to a first embodiment of the present invention.

Referring now to the drawings, wherein like reference numerals designate identical or corresponding parts throughout the several views, and more particularly to FIG. 2 thereof, FIG. 2 is a circuit diagram showing a semiconductor integrate circuit according to a first embodiment of the present invention. This circuit includes a resistor 5 connected to a power source Vcc, a MOS transistor (hereinafter referred to as an "intrinsic MOS transistor") 6, and an output terminal 7 connected to a source of the intrinsic MOS transistor 6. The source of the intrinsic MOS transistor 6 is connected to the resistor 5, a drain of the intrinsic MOS transistor 6 is connected to a power source at ground potential, and a gate thereof is connected to the drain. In the intrinsic MOS transistor 6, the impurity concentration of the channel region is substantially equal to that of that substrate surface, and the potential of the source is equal to that of the substrate.

Figure 3A:
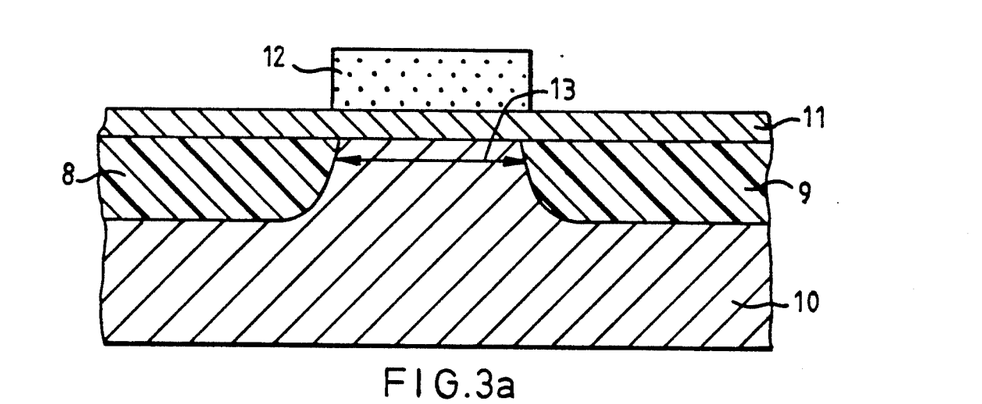
FIG. 3a is a cross-sectional view showing a first embodiment of an intrinsic MOS transistor employed in the first embodiment of the present invention.

The intrinsic MOS transistor 6 will now be described referring to FIG. 3a which is a cross-sectional view of the intrinsic MOS transistor 6.

In this intrinsic MOS transistor 6, an insulating layer 11 is formed on a semiconductor substrate 10 having a source region 8 and a drain region 9. A gate electrode 12 is formed on the insulating layer 11. No ion-implantation for threshold control is performed in a channel region 13 which is provided in an upper portion of the semiconductor substrate 10 between the source region 8 and the drain region 9. Thus, the impurity concentration of the channel region 13 is substantially equal to that of the surface of the semiconductor substrate 10. More specifically, it is desirable that the impurity concentration of the source region 8 and the drain region 9 be $1 \times 10^{19}/cm^3$, and the impurity concentration of the surface portion of the channel region 13 be $1 \times 10^{16}/cm^3$ to $1 \times 10^{18}/cm^3$.

According to this semiconductor integrated circuit, a threshold voltage Vth of the intrinsic MOS transistor 6 is outputted from the output terminal 7. Since an impurity is not ion-implanted for threshold control in the channel region in the intrinsic MOS transistor 6, the threshold voltage Vth is higher than a forward voltage drop VF of the diode. For example, the threshold voltage is about 2 V when the semiconductor substrate 10 is an N-type semiconductor substrate having an impurity concentration of $3 \times 10^{16}/cm^3$, and the gate electrode 12 is an n+poly Si gate having an oxide layer thickness of 150 angstrom. The resistor 5 is provided for reducing the dependency of the voltage of the output terminal 7 on the voltage of the power source Vcc.

Thus, it is not necessary to connect a plurality of diodes in series, in order to obtain a voltage not less than the forward voltage drop VF of the diode, at the output terminal 7. It should suffice if only one intrinsic MOS transistor 6 is connected. As has been mention above, in the prior art, the forward voltage drop VF of the diodes were adversely affected by variations in manufacturing conditions and in operating temperature. However, in the present invention, the threshold voltage Vth of only the single intrinsic MOS transistor 6 is influenced by these factors.

In the preferred embodiment of this invention the intrinsic MOS transistor has neither a deep ion-implantation nor a shallow ion-implantation. However, the intrinsic MOS transistor of the present invention may have a deep ion-implantation, provided that the surface region of the channel is not ion-implanted, as next discussed.

For preventing punch through current between the source and drain regions, ions may be implanted into the area between the source and drain regions. In that case, the density of the region under the channel region becomes higher than that of the substrate. If the region under the channel region, which impurity density is higher than that of the substrate in the final product of the MOS transistor, is located deeper than the depletion region of the MOS transistor, the threshold voltage of the MOS transistor is not affected by channel ion-implantation.

The value of the depth "W" of the depletion region of the MOS transistor is defined as $$W = \sqrt{(2\epsilon_s \epsilon_o (2\phi_B)/q N_B)}$$

In this definition of depth W, $\epsilon_2$ is the relative dielectric constant, e.g. $\epsilon_s$ is 11.9 in a semiconductor substrate of silicon; $\epsilon_o$ is the vacuum dielectric factor, i.e. $\epsilon_o$ is $8.854 \times 10^{-14}$ F/cm; q is the electron intrinsic charge, i.e. q is $1.6 \times 10^{-19}$ c; $N_B$ is the impurity concentration of semiconductor substrate, e.g. $N_B$ is a value from $1 \times 10^{15}$ to $1 \times 10^{18}$ cm$^{-3}$; and $\phi_B$ is the built-in potential, i.e. $\phi_B$ is defined as $\phi_B = KT/q \ln(N_B/n_i)$.

In expression $\phi_B$, K is the Boltzman constant, i.e. K is $1.38 \times 10^{-23}$ J/K; T is absolute temperature, e.g. 300K; and $n_i$ is the intrinsic carrier concentration, e.g. $1.45 \times 10^{10}$ cm$^{-3}$.

The depth W of the depletion region of the MOS transistor is a value from 4 to 80 angstroms in this example. Then, if the region under the channel region is provided with an impurity density higher than that of the substrate in the final product of the MOS transistor and is located deeper than from 4 to 80 angstroms beneath the channel region, the threshold voltage of the MOS transistor is not affected by channel ion-implantation. Therefore, such a MOS transistor functions as the intrinsic MOS transistor of this invention, has the same advantages of the embodiment shown in FIG. 3a, and is considered to be an intrinsic MOS transistor in the context of the present invention insofar as no ion implantation is made for threshold control.

Figure 3B:
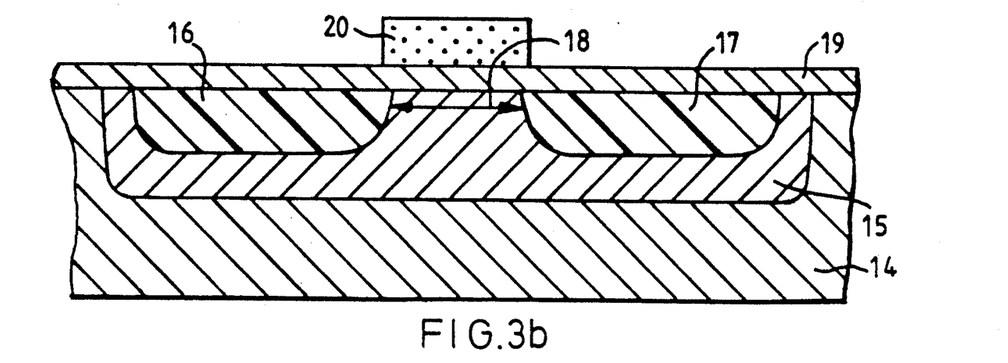
FIG. 3b is a cross-sectional view showing a second embodiment of an intrinsic MOS transistor employed according t the present invention.

FIG. 3b shows another example of the intrinsic MOS transistor. A well 15 is formed in a semiconductor substrate 14. The conductivity type of the well 15 is opposite to that of the substrate 14. A source region 16 and a drain region 17 are formed in the well 15. A channel region 18 is provided in an upper portion of the semiconductor substrate 14 between the source 16 and the drain 17. An insulating layer 19 is formed on the semiconductor substrate 14, well 15, source region 16 and drain region 17. A gate electrode 20 is formed on that part of the insulating layer 19 which is situated above the channel region 18. No ion-implantation for threshold control is performed in the channel region 18 between the source 16 and the drain 17. Thus, the impurity concentration of the channel region 18 is equal to that of the surface portion of the well 15. This transistor has substantially the same advantages as the transistor shown in FIG. 3a.

Figure 3C:
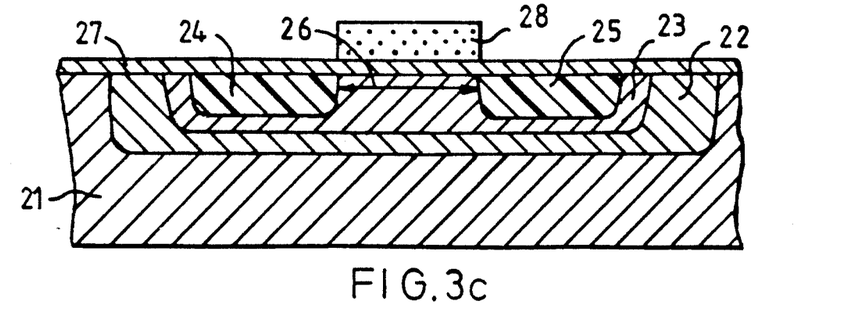
FIG. 3c is a cross-sectional view showing a third embodiment of an intrinsic MOS transistor employed according to the present invention.

FIG. 3c shows still another example of the intrinsic MOS transistor. In this transistor, a first well 22 is formed in a semiconductor substrate 21. The conductivity type of the first well 22 is opposite to that of the substrate 21. In addition, a second well 23, having the same conductivity type as the semiconductor substrate 21, is formed in the first well 22. A source region 24 and a drain region 25, both having the conductivity type opposite to that of the substrate 21, are formed in the second well 23. A channel region 26 is provided in upper portion of the semiconductor substrate 21 between the source region 24 and the drain region 25. A gate electrode 28 is formed on that part of the insulating layer 27, which is situated above the channel region 26. No ion-implantation for threshold control is carried out in the channel region 26 between the source region 24 and the drain region 25. Thus, the impurity concentration of the channel region 26 is equal to that of the surface portion of the second well 23. This transistor has the same advantages as the transistor shown in FIG. 3a. The provision of the first well 22 which is substrate based on the second well 23 which is not substrate results in separation of the second well 23 from the substrate and enables forming in the substrate other transistors having a channel with the same conductivity type of the semiconductor substrate 21.

Further, in another embodiment, the intrinsic MOS transistor includes a semiconductor substrate, and a epitaxial substrate formed on the semiconductor substrate. The epitaxial substrate includes a source region, a drain region, a channel region which is provided in an upper portion of the epitaxial substrate. No ion-implantation for threshold control is performed. This transistor has the same advantages as the transistor shown in FIG. 3a.

Figure 4:
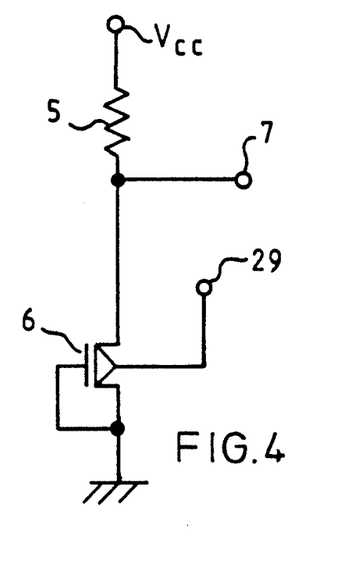
FIG. 4 is a circuit diagram showing a reference voltage generating circuit according to a second embodiment of the present invention.

FIG. 4 shows a semiconductor integrated circuit according to a second embodiment of the present invention. This circuit is designed such that a substrate bias is applied to the intrinsic MOS transistor 6 via substrate bias terminal 29 shown in FIG. 2 so that the threshold voltage Vth may be varied. The substrate bias is provided to produce an output voltage level higher than or equal to the source voltage level of the MOS transistor 6.

According to the semiconductor integrated circuit shown in FIG. 4, the same advantages as those of the first embodiment can be attained. Further, by changing the substrate bias of the intrinsic MOS transistor 6, the threshold voltage Vth can be varied to produce a desired output voltage.

Figure 5:
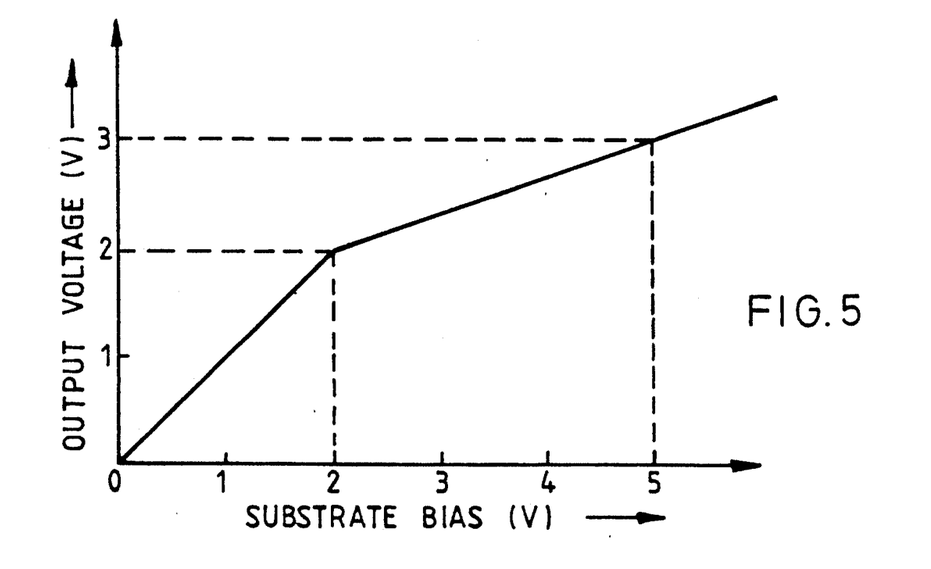
FIG. 5 is a graph showing the relationship between the substrate bias of the intrinsic MOS transistor and the output voltage according to the second embodiment of the present invention.

FIG. 5 is a graph showing the relationship between the substrate bias and the output voltage of the intrinsic MOS transistor which has a substrate bias terminal connected to Vcc in the second embodiment shown in FIG. 4. The output voltage of the intrinsic MOS transistor corresponds to substrate bias.

Figure 6:
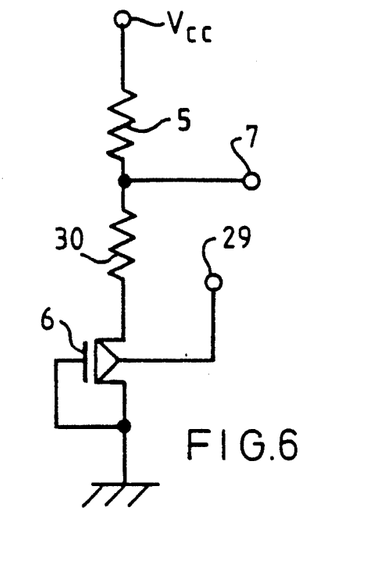
FIG. 6 is a circuit diagram showing a reference voltage generating circuit according to a third embodiment of the present invention.

FIG. 6 shows a semiconductor integrated circuit according to a third embodiment of the present invention. A resistor 30 is connected between the source of the intrinsic MOS transistor 6 and the output terminal 7 thereby to isolate the MOS transistor from the load connected to the output terminal 7. Unnecessary voltage change of the output voltage can be further prevented by a degree corresponding to the voltage drop due to the resistor 30. For instance, when the resistor is 700K ohm, the resistor 30 is set to a very low value, i.e. about 10K ohm.

Figure 7A:
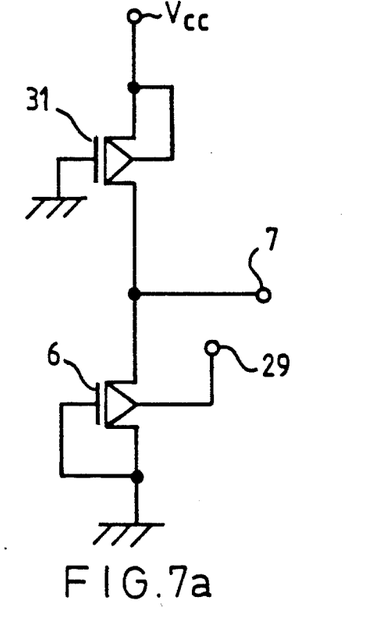
FIG. 7a is a circuit diagram showing a reference voltage generating circuit according to a embodiment of this invention.

FIG. 7a shows a semiconductor integrated circuit according to a fourth embodiment of the present invention. In this circuit, a load MOS transistor 31 is substituted for the resistor 5. In FIG. 7a, the load MOS transistor 31 is a P-channel enhancement transistor, the substrate bias for which is connected to a power source Vcc.

Figure 7B:
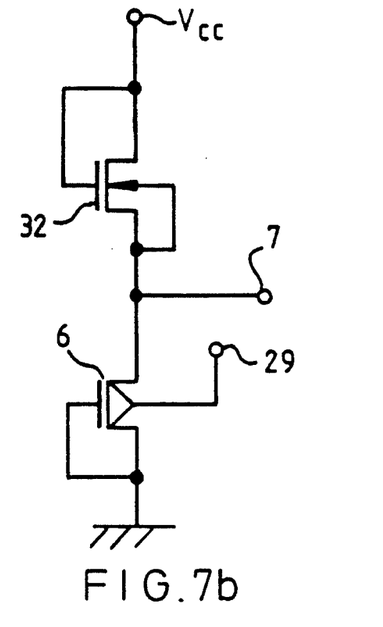
FIG. 7b is a circuit diagram showing a reference voltage generating circuit according to a fifth embodiment of this invention.

FIG. 7b shows a fifth embodiment of the present invention, wherein an N-channel enhancement transistor 32 is used as a load MOS transistor. The back gate of the transistor 32 is biased to the reference voltage at terminal 7. This embodiment has substantially the same advantages as are obtained when the resistor 5 is employed.

Figure 7C:
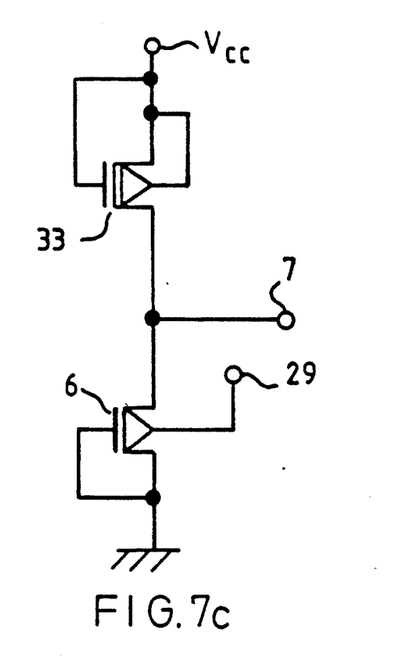
FIG. 7c is a circuit diagram showing a reference voltage generating circuit according to a sixth embodiment of this invention.

FIG. 7c shows a sixth embodiment of the present invention, wherein a P-channel depletion transistor 33 is used as a load MOS transistor. The back gate of the transistor 32 is connected to a power source Vcc. This embodiment has substantially the same advantages as are obtained when the resistor 5 is employed.

Figure 7D:
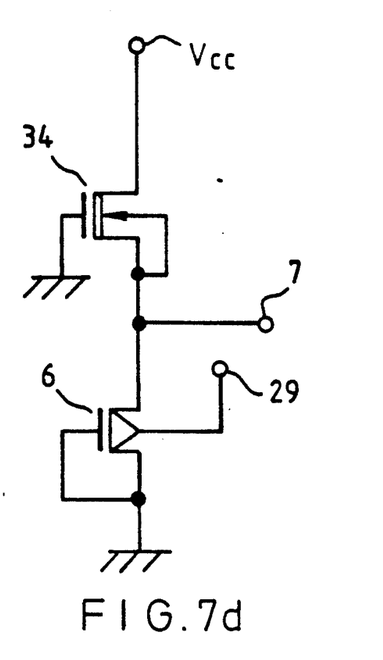
FIG. 7d is a circuit diagram showing a reference voltage generating circuit according to a seventh embodiment of this invention.

FIG. 7d shows a seventh embodiment of the present invention, wherein an N-channel depletion transistor 34 is used as a load MOS transistor. The back gate of the transistor 34 is biased to a reference voltage. This embodiment has the substantially same advantages as are obtained when the resistor 5 is employed.

Figure 8:
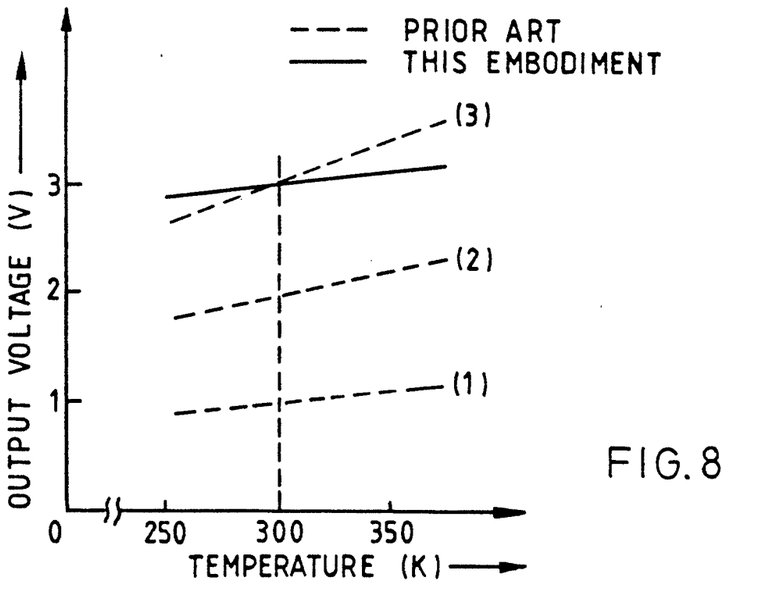
FIG. 8 is a graph of comparison data between the prior art and the second embodiment of this invention, showing the relationship between the output voltage and temperature.

FIG. 8 is a graph showing comparison data between the prior art shown in FIG. 1 and the second embodiment of the present invention, showing the relationship between output voltage and temperature. A broken line (1) indicates the case where one MOS transistor serving as a single diode is connected, a broken line (2) indicates the case where two MOS transistors serving as two diodes are connected in series, a broken line (3) indicates the case where three MOS transistors serving as three diodes are connected in series, and a solid line indicates the case of one intrinsic MOS transistor having a back gate connected to Vcc. The forward voltage drop of each diode is 1 V at 300K, and the threshold voltage of the intrinsic MOS transistor is 3 V at 300K.

When the broken lines (1) to (3) are compared, it is found that the greater the number of diodes, the greater the temperature variation. Further, when the broken line (3) is compared with the solid line, it is found that the temperature variation is smaller in the case of the solid line than in the case of the broken line (3).

Figure 9:
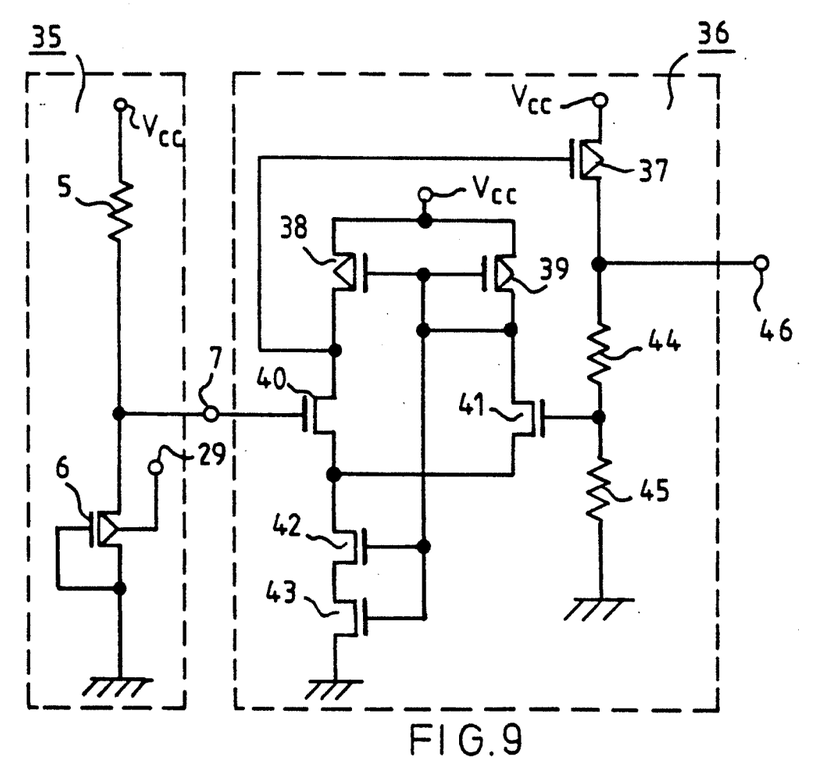
FIG. 9 is a circuit diagram showing an internal power source voltage generating circuit using the reference voltage generating circuit according to the second embodiment of this invention.

FIG. 9 is a circuit diagram showing an internal power source voltage generating circuit using a reference voltage generating circuit according to the second embodiment of the present invention.

This internal power source voltage generating circuit includes a reference voltage generating circuit 35 constituted by the semiconductor integrated circuit shown in FIG. 4, and a power source voltage generating circuit 36 connected to an output terminal 7 of the reference voltage generating circuit 35 and including at least one MOS transistor which is formed with channel ion-implantation.

The power source voltage generating circuit 36 includes a first P-channel MOS transistor 37, a second P-channel MOS transistor 38, a third P-channel MOS transistor 39, each having the source connected to a power source VCC; a first N-channel MOS transistor 40 having a drain connected to the drain of the second P-channel MOS transistor 38; a second N-channel MOS transistor 41 having a drain connected to the drain of the third P-channel MOS transistor 39; a third N-channel MOS transistor 42 having a drain connected to the source of the first N-channel MOS transistor 40; a fourth N-channel MOS transistor 43 having a drain connected to the source of the third N-channel MOS transistor 42 and a source connected to a power source at ground potential; a first resistor 44 connected between the drain of the first P-channel MOS transistor 37 and the gate of the second N-channel MOS transistor 41; and a second resistor 45 connected between the gate of the second N-channel MOS transistor 41 and ground potential.

The gate of the first P-channel MOS transistor 37 is connected to the drain of the second P-channel MOS transistor 38. The source of the first N-channel MOS transistor 40 and the source of the second N-channel MOS transistor 41 are commonly connected. The gates of the second P-channel MOS transistor 38, the third P-channel MOS transistor 39, the third N-channel MOS transistor 42 and the fourth N-channel MOS transistor 43 are also commonly connected to the gate of the first P-channel MOS transistor 37. The third P-channel MOS transistor 39 has its drain connected to its own gate. An output terminal 46 is connected to a node between the drain of the first P-channel MOS transistor 37 and the first resistor 44.

In this internal power source voltage generating circuit, the output terminal 7 of the reference voltage generating circuit 35 is connected to the gate of the first N-channel MOS transistor 40 of the power source voltage generating circuit. Thus, the power source voltage generating circuit 36 does not function, unless the output voltage from the reference voltage generating circuit 35 is higher than the threshold voltage of the first N-channel MOS transistor 40.

The object of the power source voltage generating circuit 36 is to keep the voltage at the output terminal 46 at a determined voltage level between Vcc and ground potential.

If the voltage of the output terminal 46 decreases from the determined voltage level, then the source voltage of the second N-channel MOS transistor 41 decreases. Then, the source voltage of the first N-channel MOS transistor 40 decreases as does the gate voltage of the first P-channel MOS transistor 37. So, the gate through current increases and the voltage of the output terminal 46 increases to the determined voltage level.

On the other hand, if the voltage of the output terminal 46 increases from the determined voltage level, then the gate voltage of the second N-channel MOS transistor 41 increases, then the source voltage of the first N-channel MOS transistor 40 increases, and the gate voltage of the first P-channel MOS transistor 37 increases. So, gate through current decreases and the voltage of the output terminal 46 decreases to the determined voltage level.

As above described, if the voltage of the output terminal 46 decreases temporarily or increases temporarily from the determined voltage level, the voltage of the output terminal 46 rapidly returns to the determined voltage level by the feedback action of the power source voltage generating circuit.

In the above case the reference voltage generating circuit 35 of the semiconductor integrated circuit according to this invention is used, and the same advantages as the second embodiment can be attained. Thus, a voltage being higher than the threshold voltage of the first N-channel MOS transistor 40 and lower than Vcc can be derived from the output terminal 7 of the reference voltage generating circuit 35.

An address buffer circuit using the reference voltage generating circuit 35 according to the first embodiment of this invention will now be described with reference to the circuit diagram of FIG. 10.

Figure 10:
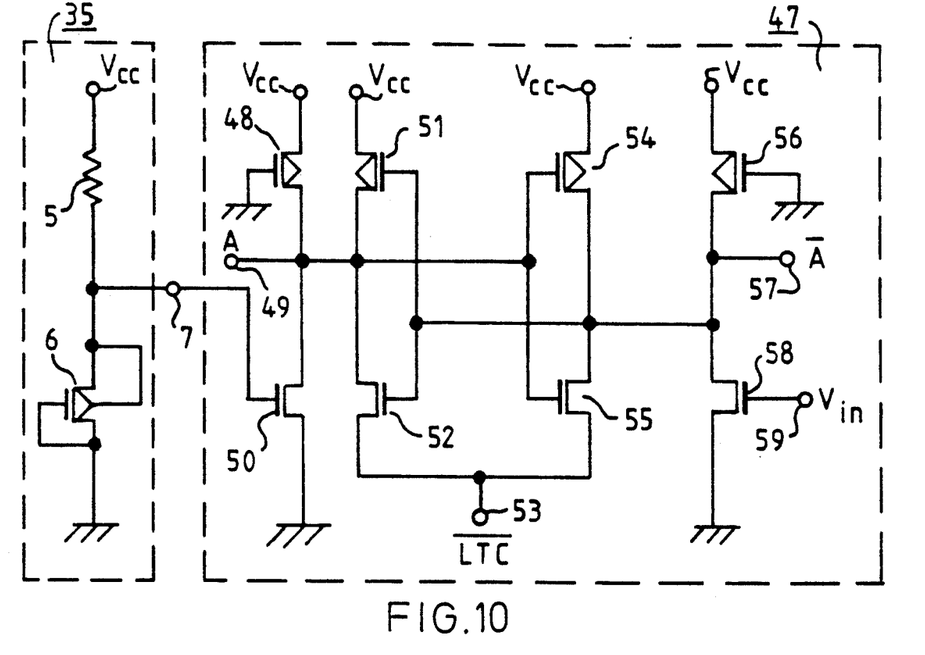
FIG. 10 is a circuit diagram showing an address buffer circuit using the reference voltage generating circuit according to the first embodiment of this invention.

As shown in FIG. 10, this address buffer circuit includes a reference voltage generating circuit 35 and a buffer circuit 47 connected to an output terminal 7 of the reference voltage generating circuit 35 and including at least one MOS transistor which is formed with channel ion-implantation.

This buffer circuit 47 includes a first P-channel MOS transistor 48 having a source connected to a Vcc and having a gate connected to a power source at ground potential; a first memory inner address signal output terminal 49 connected to the drain of the first P-channel MOS transistor 48; a first N-channel MOS transistor 50 having a drain connected to the first memory inner address signal output terminal 49, a gate connected to the output terminal 7, and a source connected to a power source at ground potential voltage; a second P-channel MOS transistor 51 having a source connected to Vcc and a drain connected to the first memory inner address signal output terminal 49; a second N-channel MOS transistor 52 having a drain connected to the drain of the second P-channel MOS transistor 51 and a gate connected to the gate of the second P-channel MOS transistor 51; a latch signal input terminal 53 connected to the source of the second N-channel MOS transistor 52; a third P-channel MOS transistor 54 having a source connected to Vcc, a gate connected to the drain of the second P-channel MOS transistor 51, and a drain connected to the gate of the second N-channel MOS transistor 52; a third N-channel MOS transistor 55 having a drain connected to the drain of the third P-channel MOS transistor 54, a gate connected to the gate of the third P-channel MOS transistor 54, and a source connected to the latch signal input terminal 53; a fourth P-channel MOS transistor 56 having a source connected to Vcc, a gate connected to a power source at ground potential, and a drain connected to the drain of the third N-channel MOS transistor 55; a second memory inner address signal output terminal 57 connected to the drain of the fourth P-channel MOS transistor 56; a fourth N-channel MOS transistor 58 having a drain connected to the second memory inner address signal output terminal 57, a source connected to a power source at ground potential and a gate; and an outer signal input terminal 59 connected to the gate of the fourth MOS transistor 58.

The drain of the first P-channel MOS transistor 48, first memory inner address signal output terminal 49, the drain of the first N-channel MOS transistor 50, the drain of the second P-channel MOS transistor 51, the drain of the second N-channel MOS transistor 52, the gate of the third P-channel MOS transistor 54, and the gate of the third N-channel MOS transistor 55 are commonly connected.

Also, the gate of the second P-channel MOS transistor 51, the gate of the second N-channel MOS transistor 52, the drain of the third P-channel MOS transistor 54, the drain of the third N-channel MOS transistor 55, the drain of the fourth P-channel MOS transistor 56, the second memory inner address signal output terminal 57, and the drain of the fourth N-channel MOS transistor 58 are commonly connected.

The buffer circuit 47 compares the value of an external input signal Vin and the reference voltage, and generates a first memory inner address signal (A) and a second memory inner address signal ($\overline{A}$).

Figure 11:
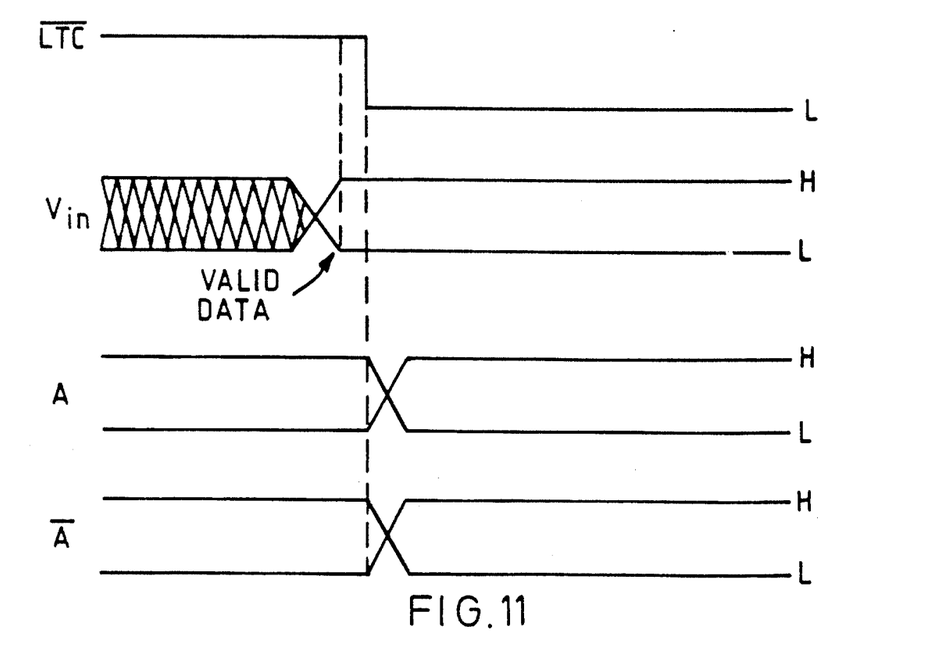
FIG. 11 is a timing chart of a latch signal, an outer input signal, and address signals flowing in the address buffer circuit using the reference voltage generating circuit according to the first embodiment of this invention.

The operation of the circuit 47 is controlled by a latch signal ($\overline{LTC}$). FIG. 11 is a signal timing chart. Just before the level of the latch signal ($\overline{LTC}$) changes from an H-level to an L-level, the outer input signal as valid data is inputted. When the level of the latch signal ($\overline{LTC}$) changes from an H-level to an L-level, the outer input signal is compared with the reference voltage. After a predetermined period of time has passed since the start of comparison, the memory inner address signal (A, $\overline{A}$) is set at the H-level or L-level. If the former is lower than the latter, the memory inner address signal (A) is set at the L-level.

Thus, using a stable reference voltage, there is obtained an address buffer less influenced by variation in manufacturing conditions or operating temperature.

In addition, the buffer circuit 47 can be used as a comparison circuit, etc. instead of as an address buffer circuit, if the input signals and output signals are replaced with a data input buffer signal, a row address strobe signal, a column address strobe signal, a write enable signal, etc.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured to letters patent of the United States is:

1. A semiconductor integrated circuit for generating a reference voltage, comprising:
   a semiconductor substrate;
   a first voltage terminal connected to a first voltage source;
   a load element formed in the semiconductor substrate and having two ends, one end of which is connected to the first voltage terminal;
   a second voltage terminal connected to a second voltage source;
   an MOS transistor formed in the semiconductor substrate and having a source, a drain, a gate and a channel having no ion-implanted region therein for threshold voltage control;
   means for connecting the other end of the load element to the source;
   means for connecting the second voltage terminal to the drain;
   means for connecting the drain to the gate; and
   an output terminal connected to the other end of the load element and to the source.

2. A semiconductor integrated circuit according to claim 1, wherein the impurity concentration of the channel of the MOS transistor is substantially the same as that of the semiconductor substrate.

3. A semiconductor integrated circuit according to claim 1, wherein the load element comprises a resistor.

4. A semiconductor integrated circuit according to claim 1, wherein the load element comprises an MOS transistor.

5. A semiconductor integrated circuit according to claim 1, further comprising:
   means for connecting the substrate of the MOS transistor to the source.

6. A semiconductor integrated circuit according to claim 1, further comprising a third voltage terminal connected to the substrate.

7. A semiconductor integrated circuit according to claim 1, wherein the MOS transistor comprises a P-channel transistor.

8. A semiconductor integrated circuit according to claim 1, wherein said means for connecting the other end of the load element to the source comprises wiring.

9. A semiconductor integrated circuit according to claim 1, wherein said means for connecting the other end of the load element to the source comprises a resistor.

10. A semiconductor integrated circuit according to claim 1, wherein said means for connecting the second voltage terminal to the drain comprises wiring.

11. A semiconductor integrated circuit according to claim 1, wherein said means for connecting the drain to the gate comprises wiring.

12. A semiconductor integrated circuit for generating a reference voltage, comprising:
   a semiconductor substrate having a first conductivity type;
   a first voltage terminal connected to a first voltage source;
   a load element formed in the semiconductor substrate and having two ends, one end of which is connected to the first voltage terminal;
   a second voltage terminal connected to a second voltage source;
   a well impurity region of a second conductivity type formed in the substrate:
   an MOS transistor formed in the well impurity region and having a channel with an impurity concentration substantially the same as that of an upper portion of the well impurity region, a source, a drain and a gate;
   means for connecting the other end of the load element to the source;
   means for connecting the second voltage terminal to the drain;
   means for connecting the drain to the gate; and
   an output terminal connected to the other end of the load element and to the source.

13. A semiconductor integrated circuit for generating a reference voltage, comprising:
   a semiconductor substrate having a first conductivity type;
   a first voltage terminal connected to a first voltage source;
   a load element formed in the semiconductor substrate and having two ends, one end of which is connected to the first voltage terminal;
   a second voltage terminal connected to a second voltage source;
   a first well impurity region of a second conductivity type formed in the substrate;
   a second well impurity region of the first conductivity type formed in the first well impurity region;

an MOS transistor formed in the second well impurity region and having a channel with an impurity concentration substantially the same as that of an upper portion of the second well impurity region, a source, a drain and a gate;

means for connecting the other end of the load element to the source;

means for connecting the second voltage terminal to the drain;

means for connecting the drain to the gate; and an output terminal connected to the other end of the load element and to the source.

14. A semiconductor integrated circuit for generating an internal power source voltage comprising:

a semiconductor substrate;

a first voltage terminal connected to a first voltage source;

a load element formed in the semiconductor substrate and having two ends, one end of which is connected to the first voltage terminal;

a second voltage terminal connected to a second voltage source;

an MOS transistor formed in the semiconductor substrate and having a source, a drain and a gate and a channel having no ion-implanted region therein for threshold voltage control;

means for connecting the other end of the load element to the source;

means for connecting the second voltage terminal to the drain;

means for connecting the drain to the gate;

an output terminal connected to the other end of the load element and to the source; and a power source voltage generating circuit formed in the semiconductor substrate and having a reference voltage level input terminal connected to the output terminal, at least one MOS transistor which is formed with channel ion-implantation, and an internal power source voltage between the voltage level of the output terminal and the voltage level of the second voltage terminal.

15. A semiconductor integrated circuit according to claim 14, wherein the power source voltage generating circuit further comprises:

a first P-channel MOS transistor having a source connected to the first voltage terminal, a drain and a gate;

a second P-channel MOS transistor having a source connected to the first voltage terminal, a drain connected to the gate of the first P-channel MOS transistor, and a gate;

a third P-channel MOS transistor having a source connected to the first voltage level, a gate connected to the gate of the second P-channel MOS transistor and a drain connected to the gate of the third P-channel MOS transistor;

a first N-channel MOS transistor having a drain connected to the drain of the first P-channel MOS transistor and the drain of the second P-channel MOS transistor, a gate connected to a reference voltage level input terminal, and a source;

a second N-channel MOS transistor having a drain connected to the gate of the second P-channel MOS transistor and the gate and the drain of the third P-channel MOS transistor, a source connected to the source of the first N-channel MOS transistor, and a gate;

a third N-channel MOS transistor having a drain connected to the source of the first N-channel MOS transistor and the source of the second N-channel MOS transistor, a gate connected to the gate of the second MOS transistor, and a source connected to the second voltage terminal;

a first load element connected between the drain of the first P-channel MOS transistor and the gate of the second N-channel MOS transistor;

a second load element connected between the gate of the second N-channel MOS transistor and the second voltage terminal; and a connecting terminal connected between the drain of the first P-channel MOS transistor and the first load element.

16. A semiconductor integrated circuit according to claim 5, wherein the first load element is a resistor and the second load element is a resistor.

17. A semiconductor integrated circuit for generating a comparing signal, comprising:

a semiconductor substrate;

a first voltage terminal connected to a first voltage source;

a load element formed in the semiconductor substrate and having two ends, one end of which is connected to the first voltage terminal;

a second voltage terminal connected to a second voltage source;

an MOS transistor formed in the semiconductor substrate and having a source, a drain, a gate and a channel having no ion-implanted region therein for threshold voltage control;

means for connecting the other end of the load element to the source;

means for connecting the second voltage terminal to the drain;

means for connecting the drain to the gate;

an output terminal connected to the other end of the load element and to the source; and a comparing circuit formed in the semiconductor substrate for comparing a value of an external input signal with a value of a reference voltage produced att he output terminal and having at least one MOS transistor which is formed with channel ion-implantation.

* * * * *